United States Patent [19]

Feeney

[11] 3,780,430

[45] Dec. 25, 1973

[54] PROCESS FOR MOUNTING ELECTRO-LUMINESCENT DISPLAYS

[75] Inventor: James Henry Feeney, Acton, Mass.

[73] Assignee: Bowmar/Ali, Inc., Acton, Mass.

[22] Filed: Sept. 25, 1972

[21] Appl. No.: 292,129

[52] U.S. Cl. .................... 29/626, 29/627, 29/630 D, 174/68.5, 317/101 CC, 339/17 B, 339/17 C

[51] Int. Cl. .......................................... H05k 3/30

[58] Field of Search ...................... 29/625, 626, 627, 29/630 D, 491, 200 J, 203 J, 203 B, 203 M, 203 L, 203 W, 203 S; 174/68 S; 313/109 S; 339/17 R, 17 B, 17 C, 17 CF, 17 L, 17 LL, 17 LM, 17 M; 317/101 B, 101 C, 101 CC

[56] References Cited

UNITED STATES PATENTS

| | | | |
|---|---|---|---|
| 3,393,449 | 7/1968 | Garcia | 174/68.5 X |
| 3,631,298 | 12/1971 | Davis | 29/626 X |
| 3,161,805 | 12/1964 | Hackler | 317/101 CC |
| 3,440,722 | 4/1969 | Paulson | 29/626 |
| 3,436,605 | 4/1969 | Landron | 317/101 CC |
| 3,588,618 | 6/1971 | Otte | 317/101 CC |
| 3,548,493 | 12/1970 | Hubbard | 29/626 |
| 3,626,086 | 12/1971 | Rubey | 174/68.5 |
| 3,631,299 | 12/1971 | Meyer | 317/101 DH |

*Primary Examiner*—Charles W. Lanham
*Assistant Examiner*—Joseph A. Walkowski
*Attorney*—John A. Young

[57] ABSTRACT

In a small hand-held calculator the electroluminescent display is in the form of a series of light emitting diodes ("chips") which are received on a printed circuit board. The electric signal output of the calculator circuit is communicated to the display through a series of pins which are stake mounted on a printed circuit board and the projected ends of these pins serve the dual purpose of communicating electric signals which determine the display and also serve to mount the printed circuit board of the display and its associated components. The pins are inclined so that the display can be disposed at whatever viewing angle is desired. Thus, although the small calculator may lie flat on a desk or other support surface, the plane of the display is disposed at an angle making viewing much more convenient, that is, at an angle approaching perpendicularity to the line of vision of the viewer.

By utilizing the pins both as electrical signal communicating means as well as mounting means it is possible to locate the display at whatever angle is desired and in a much more convenient and economical manner.

5 Claims, 6 Drawing Figures

PROCESS FOR MOUNTING ELECTRO-LUMINESCENT DISPLAYS

BACKGROUND OF THE INVENTION

In the small hand-held calculator having the cicuitry design described in copending application Ser. No. 256,286 entitled, "Calculator Display Circuit" filed May 24, 1972, invented by James H. Bunting and assigned to the same assignee as the present invention, the display or readout is in the form of light emitting diodes.

In order to maximize the convenience and viewability of the computer display the electroluminescent material forming the display is located above the level of the keyboard and at an angle to the keyboard making it more transverse to the line of sight of the viewer.

In order to improve the viewability of the readout, various expendients have been relied upon and suggested. One expedient is that the printed circuit board which mounts other electrical components will have the electroluminescent material mounted thereon and such section of the printed circuit board then folded upwardly at an angle to the plane of the principal portion of this printed circuit board. Such an expedient has turned out to be impractical because of manufacturing complications as well as cost. In other applications, it has been proposed to use mounting brackets at the ends of the electroluminescent display which serve as mounting means for holding the operative position of the electroluminescent optical readout.

It should be understood that one of the chief goals in this art is to obtain a combination of calculator circuitry and readout in the form of a small hand-held calculator and to accomplish this result structurally with minimum cost, since it is intended that the calculator will be sold at popular prices in mass market distribution. Obviously, if it is possible to obtain an improved method of mounting the readout for a small transportable hand-held calculator, to accomplish this without adding appreciably to cost, or even reducing the cost, is a valuable advance in the state of this art.

OBJECTS OF THE INVENTION

It is a principal object of the present invention to provide a new and improved method of mounting an electroluminescent readout display wherein the display is exhibited at a preferred angle making it more convenient to view the information thereon.

A further object of the present invention is to provide an improved method for mounting electroluminescent elements on printed circuit boards and in turn to mount said circuit boards in an improved fashion relative to the other circuit components.

Another object of the present invention is to provide an improved method for displaying electroluminescent medium which is disposed on a printed circuit board through conductor pins which communicate electrical signals from a computer circuit, such pins being utilized also as the mounting means for the electroluminescent printed circuit board. The pins are bent at whichever preferred angle optimizes the viewing angle for the user of the computer.

It is a further object of the invention to provide a new and more economical method for mounting an electroluminescent readout in a hand-held calculator wherein the electroluminescent elements are in the form of light emitting diodes and are formed as deposits on the substrate of a printed circuit board which is of such dimension and size as to be readily mounted and carried on a series of connector pins staked onto a second printed circuit board whereon are mounted electrical components constituting the calculator circuit.

An overall object of the present invention is to improve the process for assembling small hand-held calculators by providing new and improved techniques for mounting the optical readout information of a small handheld calculator and which is inherently more convenient and economical than previous methods.

Other objects and features of the present invention will become apparent from the following description which proceeds with reference to the accompanying drawings wherein a selected example embodiment is chosen by way of illustration of the invention and not limitation thereof.

DRAWINGS

Figure 4:
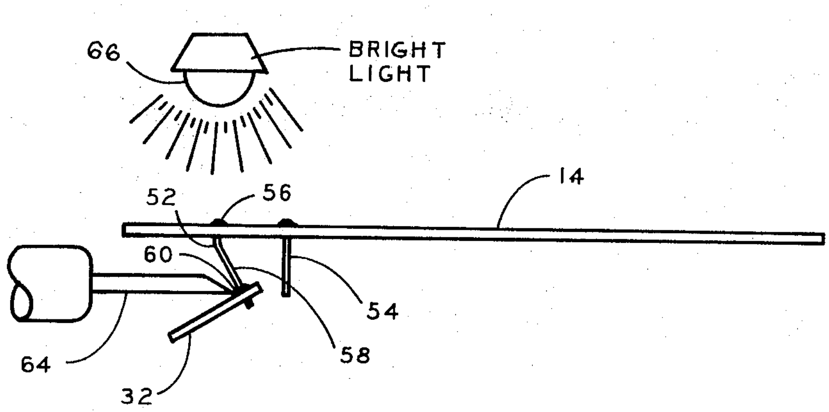
FIG. 4 illustrates the method of attachment of the printed circuit board constituting the optical readout and wherein a light is used to shine through the main printed circuit board and enabling the operator to effect solder connections at the selected locations.
Figures 5, 5A:
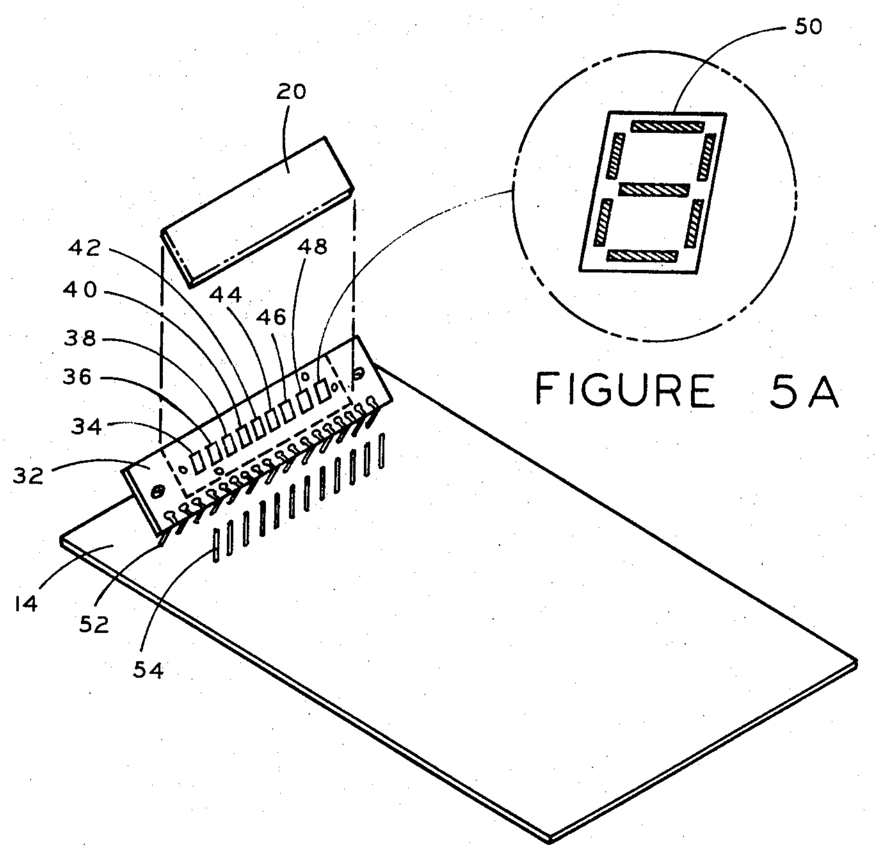

FIG. 5 is an exploded isometric view showing the readout printed circuit board in position subsequently to the step of FIG. 4 and illustrating the translucent cover plate which is next superimposed over the electro-luminescent elements; and, FIG. 5A is an enlarged view of the circled portion of FIG. 5 and illustrating the geometrical disposition of the light emitting diode elements in a pattern from which the alpha numeric information is constructed.

DETAILED DESCRIPTION OF THE INVENTION

Figure 1:
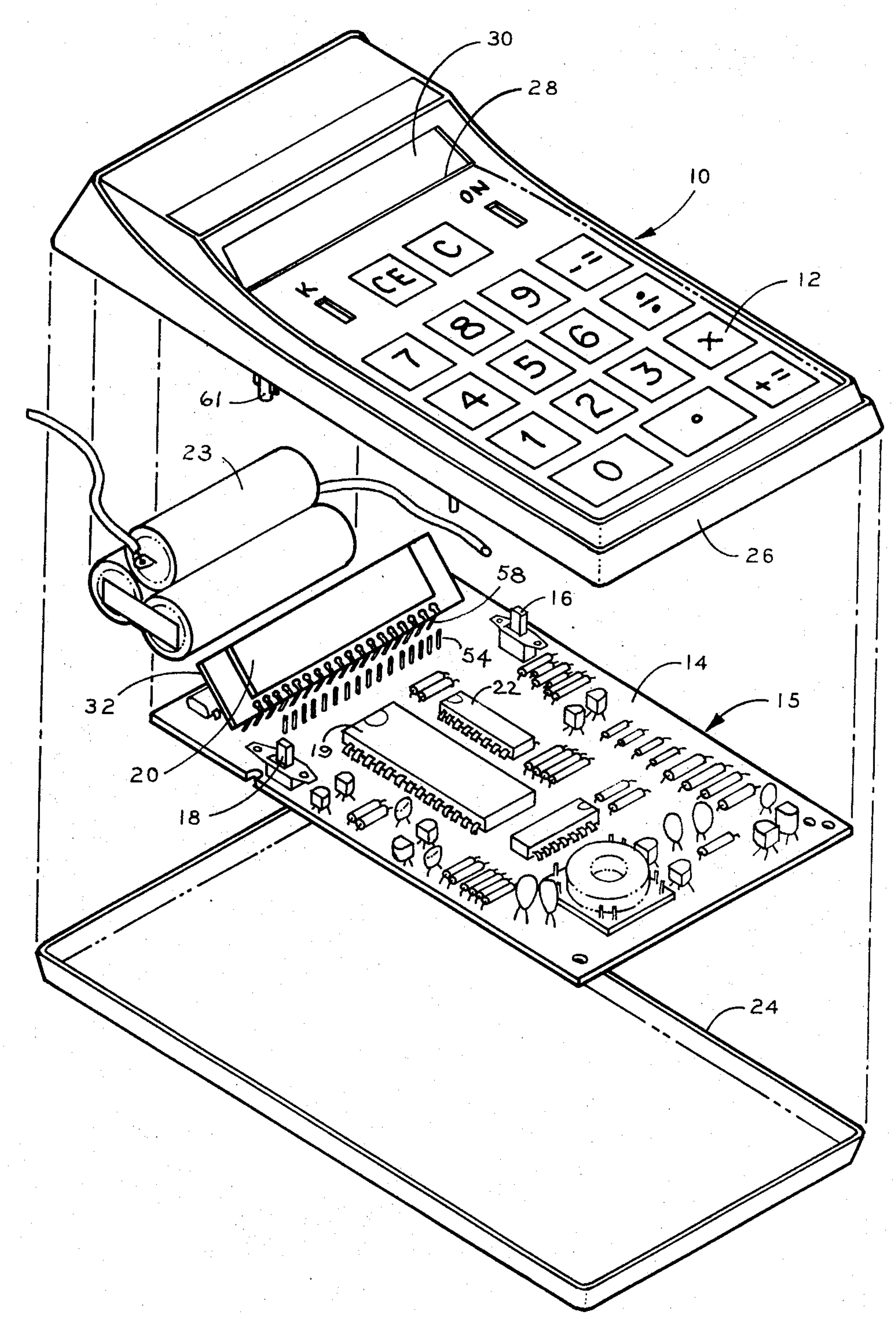
FIG. 1 is an isometric exploded view of a calculator which is constructed and assembled in accordance with the present invention.

Referring to FIG. 1, a small hand-held calculator, designated generally by reference numeral 10 is composed of a keyboard 12, a printed circuit board 14 containing a calculator circuit designated generally by reference numeral 13 and including switch 16, a constant control 18, a single chip calculator 19, drivers 22 and an optical readout which is in the form of an electroluminescent display 20.

The calculator has a power supply in the form of a series of nickel cadmium batteries or the like 23 and the entirety of the circuit, display and power means, is contained within a casing consisting of a lower shell half 24 and an upper shell half 26, the upper half including a window 28, with a shield 30. The assembly of the printed circuit board 14 and associated electrical components are fully described in copending application of James Henry Feeney "PROCESS FOR PRODUCING COMPUTER CIRCUITS UTILIZING PRINTED CIRCUIT BOARDS", filed concurrently herewith and assigned to the same assignee, i.e., Bowmar Instrument Corporation.

It is the purpose of the present invention to improve the mounting of the printed circuit board 32 which contains a number of electroluminescent elements in the form of light emitting diodes 34–50. These are also referred to as so-called display "chips".

The circuitry for illuminating the display chips to provide alpha numeric information readout is alluded to in copending application "CALCULATOR DISPLAY CIRCUIT" of James H. Bunting filed May 24, 1972, application Ser. No. 256,286 and assigned to the same assignee as the present application. The circuit details are not a part of the present invention.

More particularly, the present invention relates to the method of mounting the printed circuit board 32 and its attendant display elements including the light emitting diodes.

Figure 2:
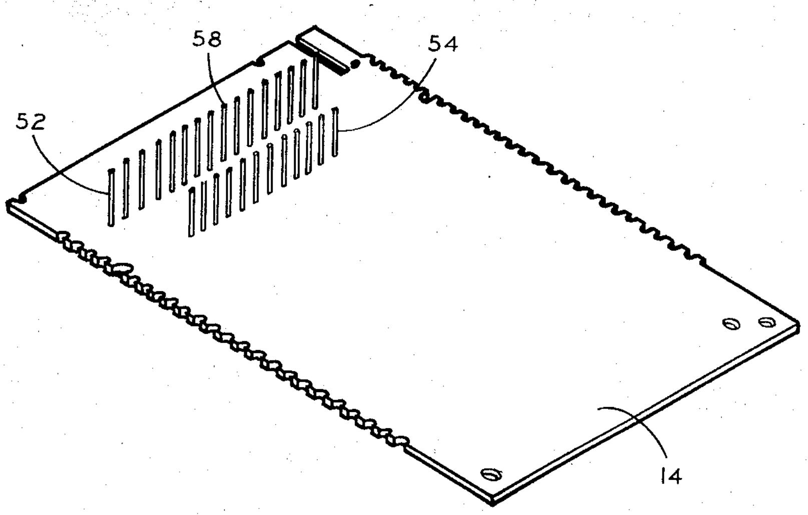
FIG. 2 is an enlarged isometric view of a printed circuit board having connector pins disposed in two rows, one of the rows of the connector pins being used to communicate electrical signals for the printed circuit optical readout and also for mounting such printed circuit readout board.

Referring to FIG. 2, in the production of printed circuit board 14 there is staked onto the board two rows of pins 52 and 54. Pins 52 are soldered at 56 (FIG. 3) to receive the electrical signal output of the calculator circuit and the projected ends 58 are then passed through companion openings in the printed circuit board 32 and are then soldered as shown at 60 (FIG. 4). The pins 52 prior to soldering are first bent to a preferred angle by means of a bending die 65 (FIG. 3) so that when the optical readout printed circuit board 32 is mounted on the ends 58 of the pins the readout printed circuit board 32 will be disposed at an angle which facilitates a readout of the alpha numeric information displayed by the electroluminescent elements, (in this case the series of light emitting diodes).

Figure 3:
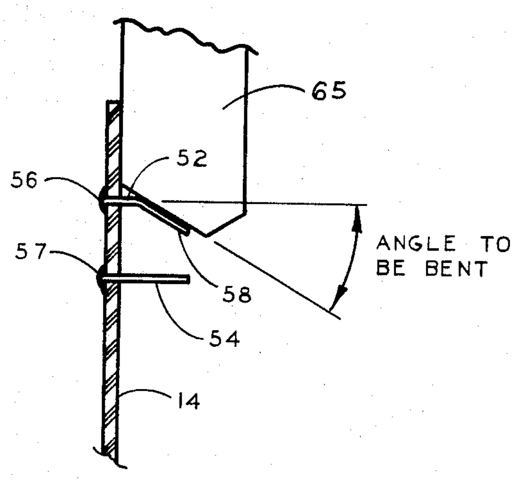
FIG. 3 is a fragmentary side elevation view of the printed circuit board and pins illustrated in FIG. 2 illustrating schematically how the mounting pins are bent from the straight position shown in FIG. 2 to the bent position of FIG. 3 prior to mounting the optical readout printed circuit board.

Solder connection 60 is effected by a soldering iron 64 and the operator can see the location of the soldering by means of a high intensity lamp 66 which is directed at the soldering location with the board 14 inverted from the position shown in FIGS. 1, 2 and 3 and light passing through the printed circuit board 14 which is translucent to permit illumination of the soldering location.

Printed circuit board constituting display 32 is at an elevation and angle relatively to the main printed circuit board 14 so that it registers with opening 28 in the upper casing 26 to exhibit an illuminated display through tinted window 30.

As indicated in FIG. 5, the electroluminescent elements are also covered by a tinted cover 70 which fits over elements to provide an improved and more readable display. Lower casing section 24 can be bolted, screwed or snapfitted to the upper section 26.

OPERATION

In operation, after the printed circuit board 14 is equipped with the electrical components which will produce the calculator circuit, the pins 52 and 54 are staked in place and soldered as indicated by 56 and 57 in FIG. 3. The row of connector pins 58 are then formed over by bending die 65 as indicated in FIG. 3 and the projected ends 58 of the bent pins are passed through suitable openings in a printed circuit display board 32 and soldering is effected by hand operation using a solder iron 64, such soldering occurring with the board 14 inverted from the position shown in FIGS. 1 and 2. A light 66 is used to provide illumination through the translucent printed circuit board 14 to facilitate viewing by the operator. The light emitting diodes on the printed circuit board 32 are then covered by a snapon cover 70 (FIG. 5) and the now completed board as shown in FIG. 1 is assembled between the upper and lower casing sections of the calculator containers.

When the completed circuit board 14 is inserted into casing section 26 the pins 54 are interfitted with a row of sockets 61 (FIG. 1) which are interconnected with the keyboard 12. When assembled, the display board 32 is at such elevation and angular disposition it will register with the opening 28 so that information displayed by electroluminescence is readily viewed through cover 70 (FIG. 5) and window 30 (FIG. 1).

The described angularity of the readout makes it more convenient to view than would be the case if the readout were in the same plane as the printed circuit board 14 because the operator can manipulate the keyboard while the calculator is lying on a desktop or other flat surface and the inclined viewing area is more transverse to the line of sight making it easier to read the information on the display.

It can be seen from the foregoing description of the invention that the pins 58 are caused to serve a dual purpose in that they serve as the electrical connecting means between the calculator circuit and the light emitting diodes and in addition serve as a mounting for the display printed circuit board 321. In this way, at no additional cost it is possible to provide a convenient yet rigid mounting and the mounting can be varied so fas as its angularity is concerned, by simply changing the degree of bending of the pins 52 (FIG. 3) in the manner indicated in FIG. 3.

The process of the present invention is therefore susceptible for use in a considerable number of different size calculators which employ different size and disposition of optical readout means.

Although the present invention has been illustrated and described in connection with a single example embodiment, it will be understood that this is illustrative and not restrictive of the invention. It is reasonably to be expected that those skilled in this art can make numerous revisions and adaptations and it is intended that such revisions and adaptations will be included within the scope of the following claims as equivalents of the invention.

What I claim is:

1. A process for mounting an electroluminescent display at a preferred viewing angle relatively to a printed circuit board containing a calculator circuit, comprising the steps of: first staking a plurality of in-row connector pins to the printed circuit board, bending each of such pins to the same predetermined angularity relatively to the plane of the printed circuit board whereby the pin ends each extend at the same angle relatively to the printed circuit board, passing each of the projected ends of the pins through coacting openings in the electroluminescent display which is disposed transversely to the projected pin ends, and thereafter soldering each projected pin end to the display to form an electrical connection between each projected pin end and the coacting portion of the electroluminescent display whereby electroluminescent information is displayed at a preferred viewing angle.

2. The process in accordance with claim 1 wherein electrical connections are formed between the projected ends of each of said connectors and the electroluminescent display material to provide electrical addressing of alphanumeric components by the pins in a manner provided by the calculator circuitry on said printed circuit board.

3. The process in accordance with claim 1 wherein said printed circuit board is comprised of a combination of epoxy-glass fiber materials and said display material is formed as a lamination of electroluminescent material deposited on a printed circuit board substrate.

4. The process in accordance with claim 1 wherein said display includes a plurality of alphanumeric readout display components spaced apart on a printed circuit board and each is separately and individually addressed by a respective one of said pins which electrically communicate signals from the computer circuit of said printed circuit board to said display circuit board.

5. The process in accordance with claim 1 wherein said display is disposed at both an elevation and angularity of preselected dimension.

* * * * *

UNITED STATES PATENT OFFICE

CERTIFICATE OF CORRECTION

Patent No. 3,780,430 Dated December 25, 1973

Inventor(s) James Henry Feeney

It is certified that error appears in the above-identified patent and that said Letters Patent are hereby corrected as shown below:

Column 1, line 67, delete "formed as deposits" and insert -- located --.

Column 4, line 31, delete "fas" and insert -- far --.

Claim 3, line 5, delete "deposited" and insert -- located --.

Signed and sealed this 30th day of April 1974.

(SEAL)
Attest:

EDWARD M. FLETCHER, JR.
Attesting Officer

C. MARSHALL DANN
Commissioner of Patents